United States Patent [19]

Hugh

[11] Patent Number: 4,517,252
[45] Date of Patent: May 14, 1985

[54] PRE-ALLOYED THICK FILM CONDUCTOR FOR USE WITH ALUMINUM WIRE BONDING AND METHOD OF BONDING

[75] Inventor: Steven C. Hugh, Redmond, Wash.
[73] Assignee: The Boeing Company, Seattle, Wash.
[21] Appl. No.: 492,512
[22] Filed: May 6, 1983
[51] Int. Cl.³ .................... H01B 1/02; B22F 7/04; B32B 15/02
[52] U.S. Cl. .................... 428/553; 419/9; 419/23; 252/514
[58] Field of Search .................. 419/9, 23; 252/514; 428/553

[56] References Cited

U.S. PATENT DOCUMENTS

| | | | |
|---|---|---|---|
| 3,385,799 | 5/1968 | Hoffman | 252/514 |
| 3,440,062 | 4/1969 | Hoffman | 252/514 X |
| 3,609,105 | 9/1971 | Cole | 252/514 |
| 3,778,305 | 12/1973 | Holmes et al. | 252/514 |
| 3,832,308 | 8/1974 | Holmes et al. | 252/514 |
| 4,090,009 | 5/1978 | Horowitz | 252/514 |
| 4,219,448 | 8/1980 | Ross | 106/1.12 |
| 4,293,451 | 10/1981 | Ross | 427/96 |
| 4,309,457 | 1/1982 | Kawasumi | 427/214 |
| 4,350,618 | 9/1982 | Hilson et al. | 106/1.13 |

OTHER PUBLICATIONS

"Thick Film Conductors Without Glass or Oxide Binders for Improved Wire Bonding in Multilayer Circuits", Riemer, Dietrich E. *Proceedings of the 1979 International Microelectronics Symposium*, pp. 143–147.

"High Reliability Wire Bonding in Multilayer Hybrid Circuits"; Steven C. Hugh et al.; 1982, IEEE, pp. 428–433.

Primary Examiner—Ben R. Padgett
Assistant Examiner—Matthew A. Thexton
Attorney, Agent, or Firm—Schwartz, Jeffery, Schwaab, Mack, Blumenthal & Koch

[57] ABSTRACT

A thick film conductor material comprising metal particles containing both gold and at least one additional element prealloyed into a single particle. The additional element may preferably be Pd and the prealloying may preferably be accomplished by coprecipitation. The conductor material, when bonded with Al wire, impedes the growth of intermetallic compounds and subsequent Kirkendall voids, even at elevated temperatures.

15 Claims, 6 Drawing Figures

PRE-ALLOYED THICK FILM CONDUCTOR FOR USE WITH ALUMINUM WIRE BONDING AND METHOD OF BONDING

The United States Government has rights in this invention pursuant to Contract No. F33615-80-C-5010 awarded by the U.S. Air Force.

BACKGROUND OF THE INVENTION

Field of the Invention

The present invention relates to thick film conductor materials and to a method for achieving lowcost hybrid circuit interconnections using aluminum wire bonded onto thick film conductor materials, and more particularly to thick film conductor materials containing both gold and added elements pre-alloyed into a single particle. The present invention also relates to hybrid circuit interconnections using a thick film conductor on top of a multi-layer ceramic substrate.

Background of the Invention

During the manufacture of hybrid circuits, wire bonding is used for the intraconnection of thin-film devices, such as circuit chips, to thick-film conductor pads, and for the interconnection of conductor pads to package posts. These two types of wire bonds result in four metallic interfaces; two interfaces at the ends of a first wire connecting the thin-film device and the thick-film conductor pad and two interfaces at the ends of a second wire connecting the thick-film conductor pad to the package post. These interfaces are illustrated in FIG. 1 as 12, 14, 16 and 18 respectively.

The wire 20 connecting the thin film chip device 22 to the thick film conductor 24 is typically aluminum and the wire 26 connecting the film conductor to the post 34 is typically gold. Since the thick film conductor 24 and the post 34 are usually gold, the interconnections 16 and 18 are reliable monometallic gold-gold bonds. Since the chip 22 has aluminum metallization, the interface 12 is also a reliable monometallic aluminum-aluminum bond. However, at interface 14 the aluminum wire 20 is bonded to a gold thick film conductor. This interface can result in a high-reliability risk because of mechanical and electrical degradation of the wire bond caused by intermetallic growth and subsequent Kirkendall voiding, especially after exposure of the bonds to elevated temperatures. Mechanical degradation is characterized by low bond strength; electrical degradation by high bond resistance.

Such degraded bonds are an obvious problem in terms of reliability and performance.

Kirkendall voiding, as used herein relates to the diffusion in solid solutions between atoms at a diffusion couple where the different atoms move at different velocities with the creation of voids. See Physical Metallurgy Principles, second edition, Chapter 10, Robert E. Reed-Hill, 1973.

Prior art thick-film conductor technology has not adequately addressed the problems associated with this high-reliability risk intermetallic bond. Many prior art compositions employ bonding agents, such as glass or metal frit, to bond the composition particles together and to hold the film to the substrate or underlying dielectric. For example, Hilson et al, in U.S. Pat. No. 4,350,618 discloses a Pd doped Au thick-film conductor used where aluminum wire bonds are employed to complete circuit connections between the thick-film conductor and a circuit chip. The composition and structure of the thick-film conductor of Hilson et al is specifically designed to reduce the chance of an occurrence of thermal runaway in the microelectronic package by increasing the surface areas of the Pd component of the Pd/Au conductor and by increasing the Au particle size. The thick film conductor of Hilson contains about 87.9% Au and 1.4% Pd and uses a powdered glass frit as a bonding agent.

Kawasumi et al, in U.S. Pat. No. 4,309,457 discloses various powders which can be used for the fabrication of multilayered-coated composite powders for use in manufacturing electric contacts. These include metallic powders of Au or Pd and alloy powders of Au and Pd. The inventive process of Kawasumi et al involves the steps utilized to form the various layers of the coating.

Ross, in U.S. Pat. Nos. 4,293,451 and 4,219,448 discloses a method for forming electrical contact areas on semiconductor devices by screening and firing a metal ink onto the device so that the device may be connected to external circuitry. The use of Au and Pd as constituents of a thick film metallization layer is discussed. The inventions of Ross relate to a method of fabricating an electrical contact on a substrate and to various metal powder compositions for deposition and firing on a substrate. The composition of Ross utilizes a metal frit having a low metalizing point as a bonding agent.

Horowitz, in U.S. Pat. No. 4,090,009 discusses compositions which are useful for making electrical conductor patterns on a non-conductive substrate. The powders consist of finely divided Pd/Ag coprecipitated alloys formed by reductive precipitation from solutions containing salts of the metals and an inorganic binder. An inorganic binder, constituting 9–25% by weight of the composition, is provided to produce an acceptable level of adhesion while permitting adequate conductivity. In U.S. Pat. No. 4,001,146 Horowitz discloses a powder for forming a conductor patter on a substrate, the powder comprising Ag or Ag mixed with a second metal powder such as Pd in a ratio of 17/1 and an organic binder such as copper oxide or lead oxide and bis-muth oxide.

U.S. Pat. No. 3,609,105 discloses a metallization composition for forming electrically conductive areas on dielectric materials which will form secure bonds with conductive and mechanical attachments. The composition is a mixture by weight of approximately 64% Au, 32% Pd and 4% Ag together with a glass frit or metal oxide.

Holmes et al, in U.S. Pat. Nos. 3,832,308 and 3,778,305 discloses an electrically conductive composition used to form a terminal bonded to a substrate. One of the compositions disclosed comprises 70–95% by weight coprecipitated Pd/Au alloy particles with the remainder being a glass frit.

Hoffman in U.S. Pat. Nos. 3,440,062 and 3,385,799 discloses a metalizing composition of 70–95% noble metal powder with the remainder being an inorganic vehicle. The powder may be a Pd/Au mixture. As recognized in U.S. Pat. No. 3,609,105 the compositions of Hoffman do not provide adequate strength between the composition and the substrate or attachment.

Other metalizing compositions of interest are disclosed in U.S. Pat. No. 4,186,244 to Deffeyes et al; U.S. Pat. No. 3,846,345 to Mason et al; U.S. Pat. No. 3,537,892 to Milkovich et al; U.S. Pat. No. 3,347,799 to Wagner; U.S. Pat. No. 3,337,365 to Mones and U.S. Pat. No. 3,305,326 to Longo.

As exemplified in the references discussed above, most thick film conductor materials are manufactured by mixing together small particles of conductive metal and bonding agents, and then suspending the mixture in an organic vehicle so that it can be screen printed. Bonding agents in the mixture are frit and/or reactive metals added to facilitate adhesion of the thick film to the substrate or underlying dielectric.

After the material is screen printed, the metal and bonding agents are heated (fired) in a furnace, typically at temperatures between 600 and 1000 degrees centigrade. During this heating process, the organic vehicle burns out of the thick film and the metal particles sinter together to form a continuous, conductive sheet.

The bonding agents of the thick film combine during the firing process to form an adhesive which attaches the fired thick film to the substrate upon which it was screen printed. When the thick-film materials are printed and fired, these bonding agents tend to migrate to the surface of the film and form a crust, which inhibits the wire bondability of the film. The thicker the materials are printed, the thicker the crust becomes, and thus the conductor is harder to bond to. Reduced-thickness conductors have been developed that help, to some extent, to alleviate this problem.

The use of thick film materials without the addition of the bonding agents is also possible providing a means of adhering the thick film to the substrate is provided— such as a vitreous dielectric, printed on the substrate prior to the application of the conductor material as taught by D. E. Riemor in "Thick Film Conductors Without Glass or Oxide Binders For Improved Wire Bonding In Multilayered Circuits"; Proceedings of the 1979 International Microelectronics Symposium, pp 143–147, hereby incorporated by reference. In such processes, upon firing, the conductor is wetted by the dielectric to form a chemical and physical bond.

Limiting the growth of intermetallic compounds formed at interconnections between the conductor and connecting wires or the like has been shown in the past to be possible by adding small amounts of other conductive elements such as palladium, platinum, or silver to a gold thick film. These elements are usually added in particulate form. When the thick film is fired at a high enough temperature to sinter the particles of conductive metal together, the added element becomes alloyed with the gold. This conductor may then be wire bonded with aluminum wires as shown in FIG. 1. During subsequent high temperature aging of the wire bonds, the element or elements alloyed with the gold form a diffusion barrier at the wire bond interface which slows or stops the formation of harmful intermetallic compounds and subsequent Kirkendall voiding. The action of the alloyed element is dependent upon its dispersion in the fired conductor; i.e., the greater the dispersion, the more effective the conductor is in limiting intermetallic growth and Kirkendall voiding. This dispersion, or degree of alloying, has been controlled in the past by selecting small enough particles and high enough firing temperatures to promote good conductor alloying. However, this prior art method of controlling the degree of alloying is inadequate since, as it does not promote complete alloying, voiding and bond lifting can still occur. In addition, with the prior art methods, the degree of alloying disadvantageously remains dependent upon the thick film firing process, and therefore requires firing almost to the melting point of the material.

SUMMARY OF THE INVENTION

It is therefore a primary object of the present invention to provide an improved interconnection between thin-film devices and thick-film conductor pads.

It is also an object of the present invention to provide a reliable aluminum wire bond on a gold, thick-film conductor.

It is a further object of the present invention to provide a conductor material which will promote high initial wire bondability and limit the growth of intermetallic compounds at the wire/conductor bond.

It is a still further object of the present invention to provide a new conductor material, which, when properly bonded with aluminum wire, will impede the growth of intermetallic compounds and subsequent Kirkendall voids.

It is a further object of the present invention to provide an impurity-free, thick-film top conductor containing no frit or reactive metal-oxide bonding agents (i.e., unfluxed).

It is a still further object of the present invention to provide a method for forming aluminum wire/thick-film conductor interconnections.

These, as well as other objects and purposes of the present invention as embodied and broadly described herein, are achieved in accordance with a preferred embodiment of the present invention which may comprise a thick film material suitable for applying onto a substrate. The material comprises metal particles containing gold which is prealloyed with at least one additional element. By prealloying, the gold and the additional element are uniformly dispersed throughout the material to impede the growth of intermetallic compounds at any site on the material where a bond to a non-gold member is made. Preferably, the additional material prealloyed with the gold is palladium. It is also preferred that the metal particles are prealloyed by coprecipitation out of a single solution. Preferably, the metal particles which comprise the material are of the generally uniform size of less than about 5 microns and contain in the range of approximately 95 to 99% gold and 1 to 5% palladium and more preferably in the range of approximately 98.1 to 98.7% gold and 1.3 to 1.9% palladium. Due to the excellent dispersion of the gold and palladium in the material, the prealloyed material produces a high strength, low electrical resistance bond essentially independent of the firing temperature of the material on its substrate or dielectric. Preferably, the thick film material of the present invention is substantially all metallic in order to promote high initial wire bond ability although some non-metallic binder can be tolerated where a lower initial bond strength is acceptable.

In accordance with the method of the present invention, a thick film conductor is formed by prealloying particles containing gold with at least one additional element and preparing an ink from the prealloyed particles. The ink is then screened, preferably onto a vitreous dielectric, after which it is fired at a temperature of between about 750° C. to 1000° C. thereby producing a thick film conductor which can be bonded with aluminum wire to provide a high strength, low electrical resistance bond which is resistant to the formation of intermetallic compounds throughout the conductor.

BRIEF DESCRIPTION OF THE DRAWINGS

The accompanying drawings together with the description, serves to explain the principles of the present invention. In the drawings.

DETAILED DESCRIPTION OF THE INVENTION

Figure 1:
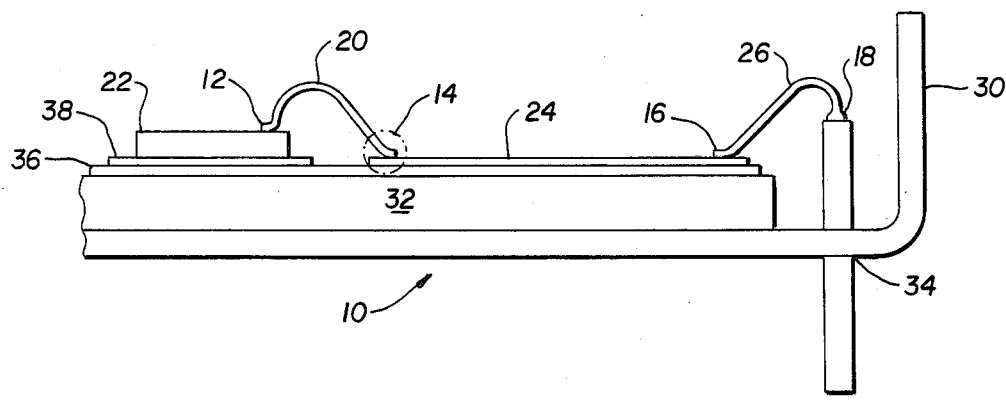
FIG. 1 is a plane view of an assembled exemplary hybrid circuit.

Reference will now be made in detail to the presently preferred embodiment of the invention. Turning first of FIG. 1 there is illustrated an exemplary assembled hybrid circuit showing the various bond interfaces. The hybrid circuit, generally 10, includes a case 30 on which a substrate 32 is formed. Passing through the case 30 is a terminal post 34. Positioned above the substrate 32 is a layer of dielectric material 36. A thin-film chip device 35 is positioned over a portion of the dielectric 36 and a thick film conductor 24 is positioned over another portion of the dielectric. A wire 20, typically aluminum, connects the chip 22 to the conductor 24 at interconnections 12 and 14. A second wire 26, typically gold, connects the thick-film structure 24 to the post 34 which is also typically made of gold. It is the intermetallic interface 14 between the aluminum wire 20 and the thick film gold conductor 24 with which the present invention is primarily concerned. The interface 12 is typically a monometallic aluminum-aluminum bond and the interfaces 16 and 18 are typically gold-gold monometallic bonds. These bonds present no risk in terms of intermetallic formations as opposed to the risk of mechanical and electrical degradation at the aluminum-gold bond 14.

In accordance with the present invention, reliable aluminum wire bonds on gold thick-film conductors are achieved by promoting high initial bondability and by limiting the growth of intermetallic compounds at the gold-aluminum bond which can lead to Kirkendall voiding. In accordance with the present invention, a thick film material is provided which comprises metal particles containing both gold and an added element or elements, for limiting intermetallic diffusion (such as Pd), prealloyed into a single particle. The alloy is preferably manufactured by coprecipitation although other methods of prealloying such as heat or rapid solidification of ultra fine particles are possible.

A conductor according to the present invention, when bonded with aluminum wire and aged, even at elevated temperatures, maintains a good mechanical and electrical bond by impeding the growth of intermetallic compounds and subsequent Kirkendall voids. This is made possible by the excellent dispersion of the alloyed element(s) in the fired gold conductor due to the prealloyed condition of the material.

In order to promote high conductivity, the material should be high in gold content. Materials in which the gold content of the metallic component of the material is in the range of 95 to 99% are within the scope of the invention. Lower gold contents tend to result in lower material conductivity and the need for higher firing temperatures.

Palladium, prealloyed with the gold, is preferably used to form the dispersion layer. The palladium content is preferably in the range of 1 to 5%. Even with prealloying, less than 1% Pd results in intermetallic growth since an inadequate diffusion layer will be created. More than 5% Pd adversely effects the conductivity of the resulting conductor and undesirably increases the peak temperature of the firing profile. See the Constitution of Binary Alloys by Hanson.

A prealloyed gold conductor material (type B) suitable for bonding with Al wire has been tested. The material has the properties outlined in Table 1. The type B conductor material has a very uniform particle size of less than 5 microns. It contains on the order of about 1.3% palladium and 98.7% gold. The gold and palladium have been prealloyed by coprecipitation. This particular material contains no bonding agents to avoid the formation of any undesirable surface crust which could interfere with strong initial bondability.

TABLE 1

| PROPERTY | REQUIREMENT |
| --- | --- |
| Shelf Life | Approximately 6 months (Min) at 25° C. |
| Viscosity | As required for 5 Mil Line resolution |
| Solids Content | Approximately 90.0% (Min) |
| Composition of Pure Metallic Solids | Au: 98.4 ± 0.3% Pd: 1.6 ± 0.3% |
| Metallic Impurities | Approximately 0.1% (Max) Total |
| Glass or Oxide Bonding System | None - Pure Metals only |
| Particle Size | Approximately 5 Microns (Max) |
| Metal Particle Preparation Method | Co-Precipitation (preferred) |
| Drying | 15 Minutes (Max) at 125° C. |
| Peak Firing Temperature | 850 + 50, −100° C. |
| Firing Atmosphere | Air |

In order to establish the surprising degree of superiority of the present conducting material, specifications were prepared for two types (A and B) of impurity-free, gold thick-film conductors used as top conductors of a multilayer test module. Type A is a singularly precipitated material; i.e., it contains both gold and palladium as discrete particles. The chemical composition of this material is 98.0% Au, 2.0% Pd. Type B material is a coprecipitated Au/Pd conductor in accordance with the present invention; i.e., it contains gold and palladium alloyed before firing in a single particle. The chemical composition of this material was 98.7% Au, 1.3% Pd. Two type A materials were tested, one from Du Pont (4416) and another from Engelhard (E745A); one type B material was tested.

Analysis of the two type A conductors in their unfired state showed that the gold particles in the Engelhard ink were hexagonal flakes about 5 micrometers in diameter, and the gold particles in the Du Pont ink were spherelike pieces, the largest of which was only 2 micrometers in diameter. Even though the unfired particles are quite different, both fired inks visually appeared to be very similar. Firing was done in accordance with a standard thick-film firing profile of 875° C. peak temperature. That is, the temperature was steadily raised to the peak temperature, held for about five minutes and then lowered. The firing time was approximately 30 minutes. When the smaller particle Du Pont ink was fired, not only did all of the particles fuse together, but gold grain growth started. When the Engelhard ink was fired, the particles only fused together. Therefore, it appears that the gold and palladium were more completely alloyed in the fired Du Pont conductor than in the fired Engelhard conductor. If the Engelhard ink is fired at a higher temperature or a longer period of time, solid-state diffusion would likely occur to a greater degree, thus producing better alloy formation. However, higher firing temperatures and longer firing times are not desirable because of the increased processing costs due to furnace wear and decreased throughput.

As alluded to above, it has now been found that prealloying of the conductor material results in increased aged wire-bond integrity because the Pd in the gold powder becomes more widely dispersed (essentially in a homogeneous manner). The type A Engelhard and Du Pont conductors were not prealloyed; both were made by mixing together gold powders and palladium powders produced by a singular precipitation process. This is a process in which pure metal particles are precipitated directly from a solution of one of its salts by introducing another metal higher in the electromotive series.

The type B material was prealloyed and was prepared using a coprecipitation process. Both the Au and Pd were precipitated out of a single solution simultaneously, producing a single metal particle containing both gold and palladium in the appropriate ratio. It has been found that when ink containing the coprecipitated metal particle is fired, alloying occurs much more rapidly and completely due to the smaller diffusion paths between the dissimilar metals.

The type B material used in the test had the properties outlined in table 1 above. X-Ray diffraction tests showed that over 90% of the Pd in the conductor material was alloyed or chemically bonded with the Au in the unfired state. When fired at 875° C., the particle of the Type B material fused together by solid-state sintering.

A multilayer, thick-film test module was constructed as a test vehicle to compare conductor material types A and B.

Figure 5:
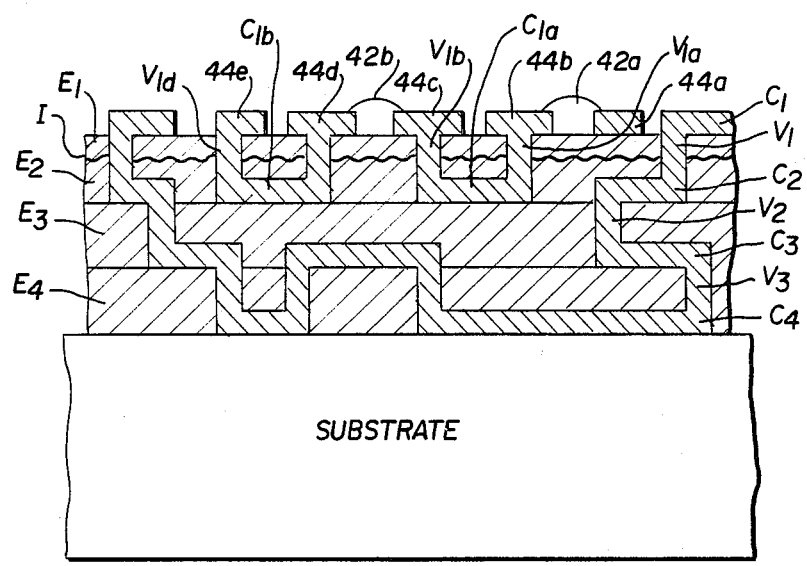
FIG. 5 illustrates a cross-section through a test module used for testing the present invention.

FIG. 5 illustrates a cross-section through the test module which was used in the accelerated long life experiments. The test module was designed as a four-conductor ($C_1$–$C_4$) multilayer ($E_1$–$E_4$) circuit. Because actual circuit designs often result in a multilayer construction, such a test module results in more realistic and reliable test results. Interface I between a top vitreous dielectric layer E1 and the dielectric layer $E_2$ simulated the degree of bonding surface roughness which may be expected on an actual hybrid circuit. The test module used wires 42 bonded to bonding pads 44 for the wire pull tests. The bonding pads and multilayer construction also served to facilitate the formation of a large number of series wire bonds with the via interconnects, $V_1$, and buried conductors $C_2$. For example, in the cross section of the test module of FIG. 5, a series of four wire bonds exists between the circuit defined by bonding pad 44a, wire 42a, bonding pad 44b, via $V_{1a}$, buried conductor $C_{1a}$, via $V_{1b}$, bonding pad 44c, wire 42b, bonding pad 44d, via $V_{1c}$, buried conductor $C_{1b}$, via $V_{1d}$ and bonding pad 44e. In the actual test module, 206 series wire bonds were used. Interconnected and interwoven third and fourth conductor layers, $C_3$ and $C_4$, respectively were used to simulate the conditions of a multilayer circuit. Die bond areas, such as area 38 of FIG. 1, were used to simulate those positions where IC chips were bonded to the top conductor $C_1$. Further, in the test module used, top ($C_1$) and buried conductor layers $C_2$ were interconnected to obtain the line resistance of the conductors and 34 vias in series. With such a series construction, the resistance was a measurable value which yielded meaningful results in terms of any variations in wire bond resistance as the module was aged. For the top conductor ($C_1$) simultaneous testing was done of the two types of material being compared (one type A and type B). The top conductor layer $C_1$ was formed on a vitreous dielectric material, Du Pont 9615 which formed an interface between the unfluxed top conductor $C_1$ and layer $E_2$ of a multilayer dielectric (which in the present example comprised Du Pont 9429). The vitreous dielectric material and the use of unfluxed conductors is described in the paper by D. E. Riemer detailed above. The buried conductor material ($C_2$–$C_4$) used was Du Pont 4019 which is the same as the material used to form the via's.

Two test modules of the type described above were fabricated, each used one of the two type A conductor materials and the type B material. A third module was also fabricated which used only type B conductor material and on which half the wires were of 1.00 mil diameter and half the wires of 1.25 mil diameter. All firing was done using a standard thick film profile of 875° C. peak temperature. As indicated in FIGS. 2 to 4 the resistivity of all three conductor materials was approximately 3 mΩ per sq. mil.

All bonds were made with a Unitex ultrasonic wedge bonder, a Gaiser 2011-20(S) tungsten-carbide bonding wedge, and Al-1% Si wire from Secon Metals Corporation. All bond were pull-strength tested.

The tests are described in detail in a paper entitled "High Reliability Wire Bonding In Multilayer Hybrid Circuits" by Steven C. Hugh and James W. Bieber delivered at the Proceedings of the thirty second Electronics Components Conference of the IEEE in San Diego. The description in the paper is hereby incorporated by reference.

Figure 2:
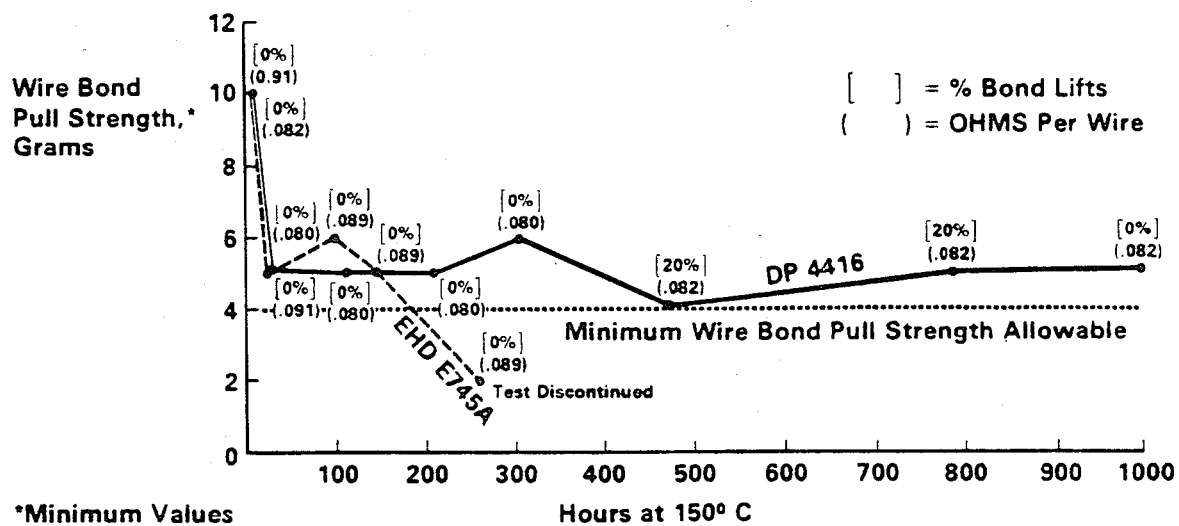
FIG. 2 is a chart depicting a comparison of the performance between two types of aged Al wire bonds, one on a first Au/Pd conductor which was not prealloyed and the other on a composition according to the present invention.
Figure 3:
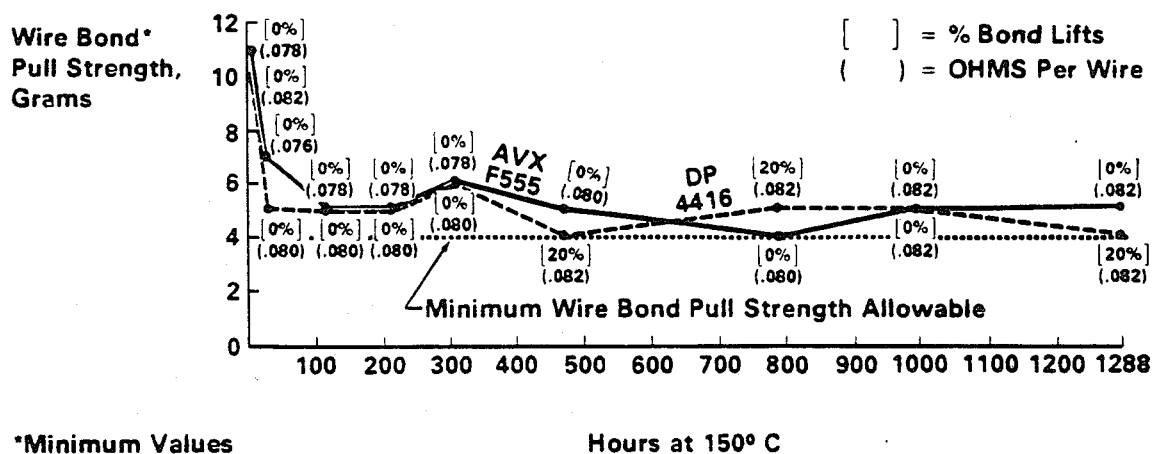
FIG. 3 is a chart depicting a comparison of the performance between two types of aged Al wire bonds, one on a second Au/Pd conductor which was not prealloyed and the other on a composition according to the present invention.
Figure 4:
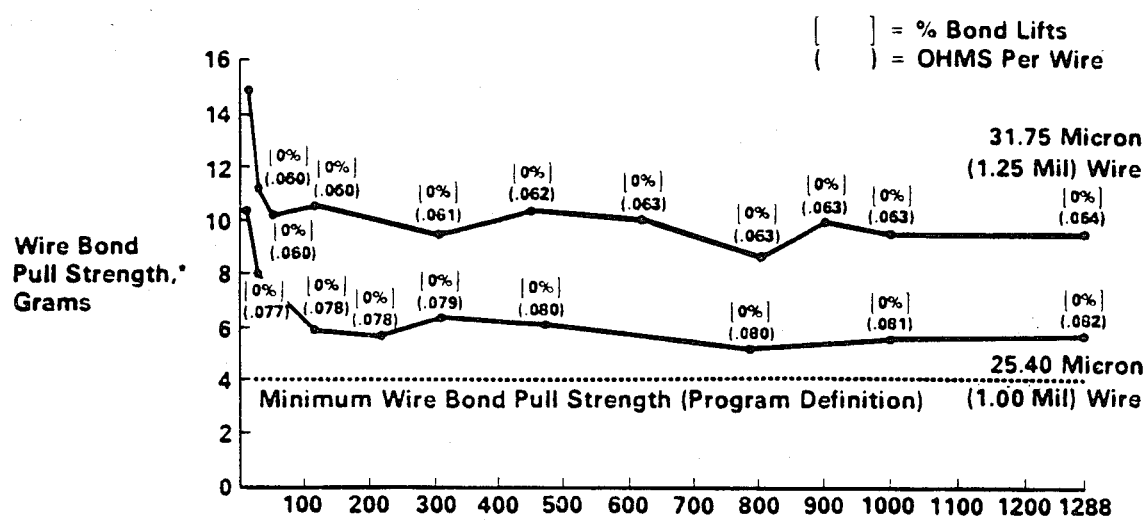
FIG. 4 is a chart depicting a comparison of the performance between two sizes of aged Al wire bonds on a Au/Pd conductor according to the present invention.

FIGS. 2 and 3 compare the aged performance (pull strength and resistance) of wire bonds on the first two test modules which were age tested at 150° C. The pull-test data represent the minimum wire-bond pull strength achieved for five wires during test and thus describe a worst-case condition. Resistance data comprises the average resistance per wire taken from 128 wires in series.

As shown in FIG. 2, tests using the Engelhard E745A conductor were discontinued after 260 hours at 150° C. due to low wire-bond pull strength. Failure was defined as the lifting of a wire bond with a force of less than 4 grams. Resistance of the wire bonds remained relatively stable for both conductors throughout the test.

Turning to FIG. 3, it can be seen that the lowest pull strength of the Du Pont 4416 conductor remained at or greater than the minimum allowable wire-bond pull strength through approximately 1288 hours, after which the Du Pont material developed a bond lifting phenomenon (20% of the bonds lifted). As with the Engelhard material, the wire bond resistance remained relatively stable for both materials throughout the test.

When comparing Du Pont 4416 with the type B conductor (FIG. 3), it can be seen that for the first 1288 hours, with both conductors, the wire-bond pull strength and resistances remained nearly the same, and both were within the program limits of 4.0 grams minimum bond pull strength and a resistance of 0.250 ohm per wire. There was no change in the resistivity of either the top conductor or underlying conductor during these tests.

There was however one very major difference between the Du Pont 4416 and the type B material; with the type B material, no bonds lifted during pull tests. All bond pull tests terminated with a fracture at the neck of the Al wire thus indicating a superior metallurgical bond between the Al wire and type B material, even after accelerated aging. This is attributed to the far superior conductor material alloying achieved with the type B material ink.

It should be appreciated that in the type B material, while the Pd is present in lower concentration, it is more widely dispersed as compared to the Du Pont 4416 and is therefore more efficient in limiting wire-bond degradation. That is why as little as 1% Pd prealloyed with 99% Au can be used to create a highly conductive material which will still be protected from Au growth into an Al wire or the like.

It is the homogeneous dispersion of the Pd and the prevention of any Pd poor areas, as a result of prealloying which forms the essence of the present invention.

The different aging behavior between the two type A materials is believed to be attributable to the relatively large difference between the initial particle size of the Engelhard and Du Pont conductors. Since the Au and Pd ratios of both materials was the same and since no glass frit or bonding agents were used with either material, the different aging behavior is believed to be a result of variations in the degree of alloying in the fixed conductors due to the differences in the initial partial size and shape.

As alluded to above and indicated by FIG. 4, additional test modules were made using type B top conductor material, which were bonded with both 1.00 mil and 1.25 mil wire and subjected to accelerated aging at 150° C. The curves of FIG. 4 compare the average pull strength and resistance results of these tests.

The unaged bond pull strengths for 1.00 mil wire was 12–15 grams; for 1.25 mil wire 18–21 grams. It is noted that these bonds, like those of the prior tests, were produced using a low power, high duration (400 ms) bond schedule which resulted in the high initial bond pull strengths indicated above and low bond resistance. This is an indication of a good metallurgical bond to the unfluxed, thick film conductor and the wire. Wire bond strength and resistance measurements were taken on each test module while the test module subjected to accelerated aging at 150° C. The top conductors, $C_1$, were printed to achieve a fired thickness of 20 micrometers and both size wire bonds were made with Al-1% Si wire. The larger wire had higher pull strength and lower resistance bonds throughout the test. For both diameter wires, the pull-test failure mode remained wire neck fracture (0% bond lifts). However, as FIG. 4 indicates, a quantatively stronger bond was achieved with the 1.25 mil bond.

Figure 6:
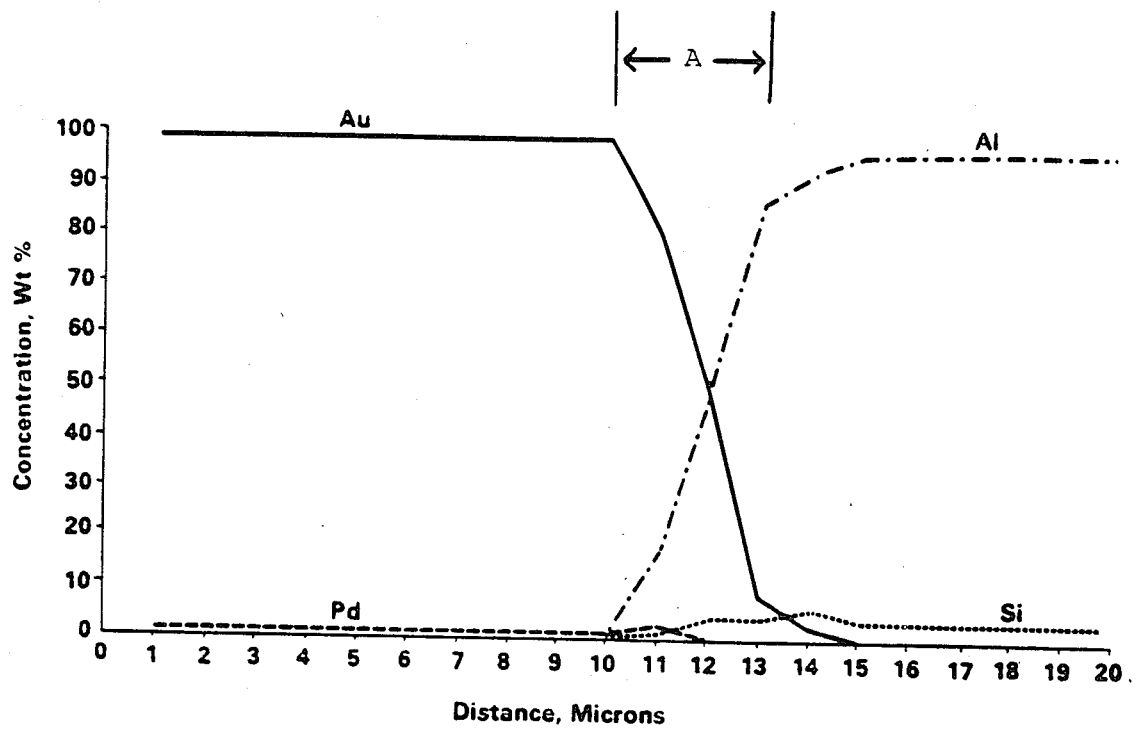
FIG. 6 illustrates a diffusion profile at a wire bond interface of a test module of FIG. 5.

FIG. 6 is a plot of the concentrations of Au, Pd, Al, and Si across the interface an 1288-hour aged bond using type B material as tested in connection with the strength and resistance tests discussed above. Note that in the interface region A of the plot, neither of the two visible intermetallic compounds can be clearly identified because they show up as a horizontal line in both Au and Al plots. One reason they cannot be readily identified is that the intermetallic region on the sample is small compared to the size of the measuring electron beam. Although the beam was focused as small as 0.1 micrometer, a region of material around the beam target site is excited and also emits secondary radiation. This enlarges the effective beam size to approximately 1 micrometer. Both intermetallic layers are less than 1 micrometer thick; therefore beam overlap into other areas prevents clear identification.

However, note that there is a slight increase in palladium concentration on the gold-rich side of the intermetallic zone. It is believed that this concentration of palladium acts as a diffusion barrier to retard the formulation of intermetallic compounds.

In order to verify that the firing profile was not critical for the prealloyed materials, test modules printed with type B top conductor material were fired at 1000° C. Results from wire-bond aging tests closely matched those achieved for the modules fired at 875° C. Raising the furnace temperature did not result in further conductor alloying for a coprecipitated conductor since alloy formation had already taken place during the production of the metal powder. It was concluded that a reliable wire bond can be achieved using a much lower temperature thick-film firing profile which, in addition to removing the firing cycle as a critical process, reduces operating costs caused by decreased wear and downtime of the furnace. Also, with type B conductor material, one firing profile and thus one furnace can be used for all multilayer processes.

Therefore, as established by the testing above, the use of thick film conductors having a metallic component in the range of 95 to 99% Au and 1 to 5% Pd results in a conductor having excellent initial aluminum wire bondability and conduction properties. Where slightly lower initial bondability can be tolerated, some flux or binder can be added to the conductor material. Moreover, conductor particle preparation, i.e. prealloying, plays a crucial role in the thick film conductors especially for aluminum wire bonding.

More specifically, an unfluxed, coprecipitated Au/Pd conductor material, printed greater than 15 micrometers thick when used in conjunction with a vitreous dielectric produces an excellent Al wire bond, and at the same time advantageously deemphasizes the thick film firing cycle as a critical process. In addition, for connecting a circuit chip to a conductor, while 1.00 mil diameter Al-1% Si wire produced adequate bonds, it was found that for many applications where larger wire can be used, a 1.25 mil diameter Al-1% Si wire bonded onto the coprecipitated Au/Pd thick film conductor produces wire bonds of even higher integrity.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, the prealloyed particles may be found by a method other than coprecipitation and the Au may be alloyed with another metal or metals other than Pd as long as that metal serves to form a dispersion barrier to prevent the formation of intermetallic compounds. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed:

1. A thick film composition essentially free of glass frit or fluxing agents, said composition comprising metal particles containing gold prealloyed with at least one additional element, the gold and said at least one additional element being uniformly dispersed through the material and prealloyed in ratios effective to impede the growth of intermetallic compounds at any metallic bonds on said material, said composition bonded to Al wire.

2. The thick film composition of claim 1 wherein said at least one additional material is Pd.

3. The thick film composition of claim 2 wherein said metal particles are prealloyed by coprecipitation.

4. The thick film composition of claim 1 wherein said metal particles are of a generally uniform size of less than about 5 microns.

5. The thick film composition of claim 3 wherein said particles contain approximately 95.0 to 99.0% Au and 1 to 5% Pd.

6. The thick film composition of claim 3 wherein said particles contain approximately 98.1–98.7% Au and 1.3 to 1.9% Pd.

7. The thick film composition of claim 5 wherein said prealloying produces high strength, low resistance bonds when fired at peak firing temperatures of from about 750° C. to 1000° C.

8. The thick film composition of claim 6 wherein said prealloying produces high strength, low resistance bonds when fired at peak firing temperatures of from about 750° C. to 1000° C.

9. A method of forming a thick film conductor essentially free of glass frit or fluxing agents comprising:

prealloying particles comprising Au with at least one additional element in ratios effective to impede intermetallic compound growth;

preparing an ink from the prealloyed particles;

screening the ink onto a vitreous dielectric;

firing the ink on the dielectric at a temperature of between about 750° C. and 1000° C. to form a thick film conductor; and bonding the thick film conductor to Al wire to provide a high strength, low resistance bond which is resistant to the formation of intermetallic compounds throughout the conductor.

10. The method of claim 9 wherein the at least one additional element comprises Pd.

11. The method of claim 10 wherein the step of prealloying comprises coprecipitating Au and Pd out of a single solution simultaneously.

12. The method of claim 10 further including bonding an Al wire to the thick film conductor using a low power, high duration bond schedule whereby a high initial strength, low resistance bond is formed.

13. The method of claim 9 wherein said prealloyed particles are less than about 5 microns in size.

14. The method of claim 9 wherein said particles comprises in the range of 95 to 99% gold and 1 to 5% Pd.

15. The method of claim 9 wherein said particles comprise in the range of 98.1 to 98.7% Au and 1.3 to 1.9% Pd.

* * * * *